United States Patent [19]

Ullrich

[11] Patent Number: 5,047,659
[45] Date of Patent: Sep. 10, 1991

[54] NON-OVERLAPPING TWO-PHASE CLOCK GENERATOR UTILIZING FLOATING INVERTERS

[75] Inventor: Manfred F. Ullrich, Denzlingen, Fed. Rep. of Germany

[73] Assignee: Deutsche ITT Industries GmbH, Freiburg, Fed. Rep. of Germany

[21] Appl. No.: 576,814

[22] Filed: Sep. 4, 1990

[30] Foreign Application Priority Data

Sep. 22, 1989 [EP] European Pat. Off. ........ 89117551.5

[51] Int. Cl.$^5$ .............................................. H03K 5/13
[52] U.S. Cl. .................... 307/269; 307/265; 307/279
[58] Field of Search .............. 307/262, 268, 269, 480, 307/481, 279; 328/62, 63

[56] References Cited

U.S. PATENT DOCUMENTS

| | | | |
|---|---|---|---|
| 4,587,441 | 5/1986 | Torelli et al. | 307/269 |
| 4,645,947 | 2/1987 | Prak | 307/269 |
| 4,761,568 | 8/1988 | Stronski | 307/269 |

FOREIGN PATENT DOCUMENTS

| | | | |
|---|---|---|---|
| 0262412 | 4/1988 | European Pat. Off. | 307/269 |
| 1117516 | 8/1989 | Japan | 307/269 |

*Primary Examiner*—Stanley D. Miller
*Assistant Examiner*—Sinh Tran
*Attorney, Agent, or Firm*—Thomas L. Peterson

[57] ABSTRACT

A two-phase clock generator generates a nonoverlapping two-phase clock from a unipolar input clock by utilizing gate delays in first and second signal paths. The output of each signal path is fed over a cross-coupled feedback path back to a logic gate in the respective other signal path. Each logic gate is a floating inverter having a first supply terminal connected to a supply voltage, and having a second supply terminal that is the feed point for the respective feedback signal from the output of the other signal path.

3 Claims, 2 Drawing Sheets

NON-OVERLAPPING TWO-PHASE CLOCK GENERATOR UTILIZING FLOATING INVERTERS

BACKGROUND OF THE INVENTION

1. Field of the Invention

The present invention is in the field of clock generator circuits for digital signal processors and the like.

2. Description of the Related Art

To control the individual functional units in digital signal processing circuits, a nonoverlapping two-phase clock is frequently necessary. Such a clock comprises a first clock and a nonoverlapping second clock. These two clocks are generated in a two-phase clock generator from a unipolar input clock which usually has a 1:1 mark/space ratio. At high signal-processing speeds, the derivation of the two overlapping clocks from a higher-frequency clock by logic combination of high and low states is no longer possible. By utilizing gate delays, however, non-overlapping clocks can be generated even at high frequencies. A typical feature of these prior art circuit arrangements is that the clock signal from the respective clock output is fed back to a logic gate contained in the respective other signal path, i.e., the feedback paths are cross-connected to the respective other signal path.

Through this signal feedback, one of the two logic gates does not change its state until the output signal in the other signal path has assumed a new state. In this manner, nonoverlapping is ensured. The nonoverlap period is determined at least by the delays of the gates in the respective signal path, which, as a rule, comprises the logic gate, several inverter stages, and an output buffer. The second inputs of the logic gates are fed with an antiphase signal derived from the input clock by means of additional inverter stages.

One disadvantage of such two-phase clock generators is that at high clock frequencies, the nonoverlap period is relatively long, so that the active clock phase is unnecessarily limited in time. On the other hand, the number of gates cannot be reduced indefinitely since in the NOR or NAND gates used, the phase of the clock fed back must be taken into consideration, so that the minimum number of gates, usually inverters, is predetermined.

SUMMARY OF THE INVENTION

Accordingly, it is the object of the invention as claimed to provide a two-phase clock generator for generating two nonoverlapping clocks whose nonoverlap period is as short as possible.

BRIEF DESCRIPTION OF THE DRAWINGS

The invention will now be explained in greater detail with reference to the accompanying drawings, in which.

DETAILED DESCRIPTION OF THE INVENTION

Figure 1:
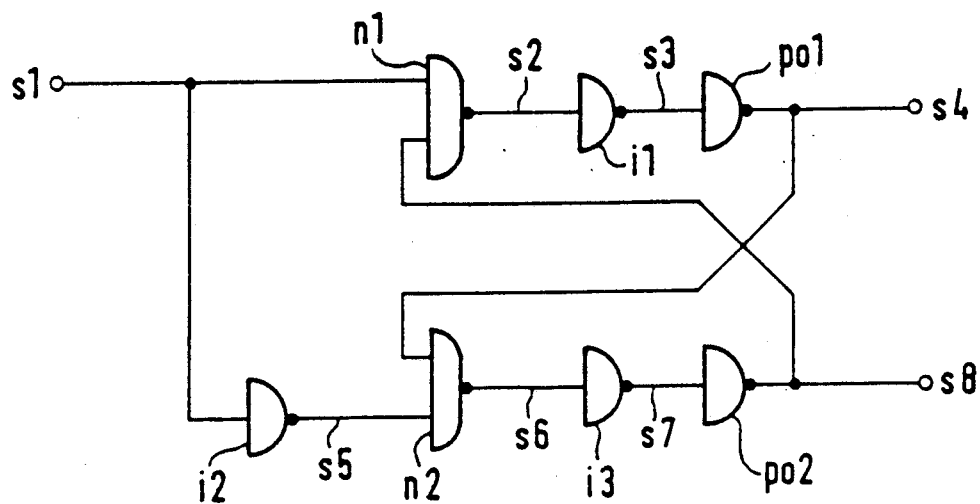
FIG. 1 is a block diagram of a prior art two-phase clock generator.

In the prior art two-phase clock generator shown in FIG. 1, an input clock s1 feeds one input of a first logic gate n1 having a first inverter i1 connected thereto which is followed by a first output buffer po1, whose output provides a first clock s4. A second signal path is connected in parallel with this first signal path. The second signal path has an input that is also fed with the input clock s1. The second signal path comprises a second inverter i2, a second logic gate n2, a third inverter i3, and a second output buffer po2 in cascade. The output of the second output buffer po2 provides a nonoverlapping second clock s8. The outputs of the first and second output buffers po1, po2 are fed back to the other inputs of the second and first logic gates n2 and n1, respectively.

Figure 2:
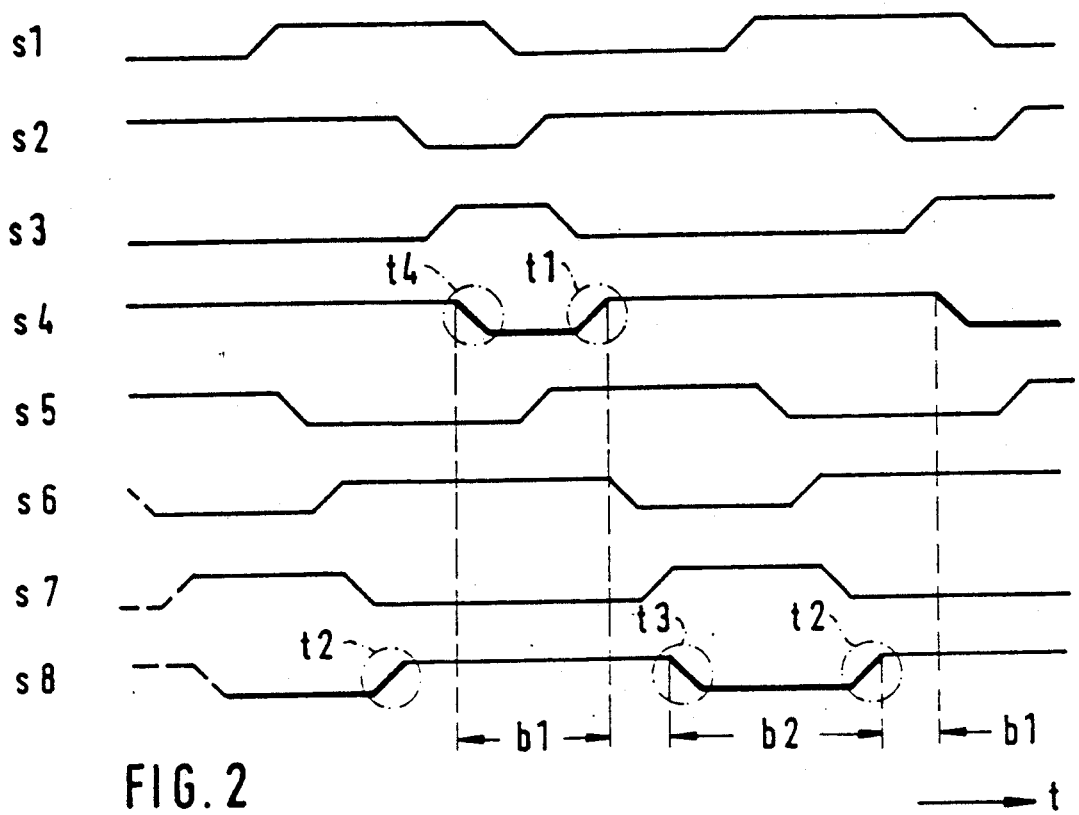
FIG. 2 is a timing diagram for the arrangement of FIG. 1.

All signals occurring in the arrangement of FIG. 1 are illustrated in FIG. 2 in a timing diagram. The first line of the timing diagram shows the unipolar input clock s1. The second line shows the output signal s2 of the first logic gate n1, which is a NAND gate. The third line shows the output signal s3 of the first inverter i1. The fourth line shows the first clock s4, namely the output signal of the output buffer po1, an inverter. The fifth line shows the output signal s5 of the second inverter i2. The sixth line shows the output signal s6 of the second logic gate n2, a NAND gate. The seventh line shows the output signal s7 of the third inverter i3. The eighth line shows the second clock s8, namely the output signal of the buffer po2, which is also an inverter.

The active portion of the first clock s4 lies in the time interval b1, and the corresponding active portion of the second clock s8 in the time interval b2. Both signals are shown as active low signals. If the active portion is to be defined by a high level, an inverter must follow in the respective clock line.

In FIG. 2, the marked instant t1 of the first clock s4 shows that only the leading (positive-going) edge of the latter triggers the decay of the second clock s8 at the instant t3. Conversely, the leading edge at the instant t2 of the second clock s8 triggers the decays of the first clock s4 at the instant t4. This results in relatively long nonoverlap periods as gaps between the active time intervals b1, b2.

Figure 3:
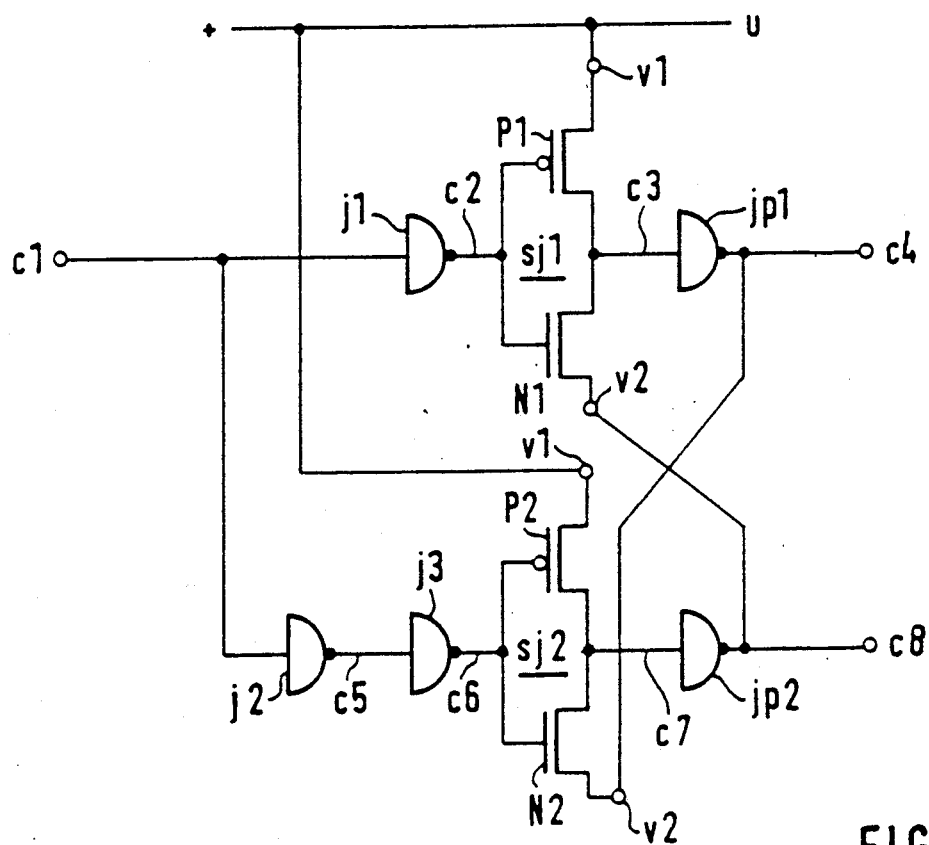
FIG. 3 is a block diagram of a two-phase clock generator in accordance with the invention.

FIG. 3 shows a block diagram of a two-phase clock generator in accordance with the invention. The first signal path, which is fed with the input clock c1, contains a first inverter j1, a first floating inverter sj1, and an output buffer jp1 in cascade. In the second signal path, which is also fed with the input clock c1, a second inverter j2, a third inverter j3, a second floating inverter sj2, and a second output buffer jp2 are connected in cascade. The first three inverters j1, j2, j3, form antiphase drive signals c2, c6. The antiphase drive signals are provided as inputs of the two floating inverters sj1, sj2, whose respective first supply terminals v1 are connected to a fixed supply voltage u. Each of the floating inverters sj1, sj2 has a respective second supply terminal v2 which serves as a feed point for the signal fed back. The output of the first output buffer jp1, i.e., a first clock c4, is fed back to the second supply terminal v2 of the second floating inverter sj2, and the output of the second output buffer jp2, i.e., a second clock c8, is fed back to the second supply terminal v2 of the first floating inverter sj1. As a result, outputs c3, c7 of the two floating inverters sj1, sj2, respectively, can go to a low level only if the second supply terminal v2 of these inverters are at this low level, too. Through this forced interconnection, the two outputs c3, c7 of the two floating inverters sj1, sj2 are never simultaneously low. In the presence of inverting output buffers jp1, jp2, the clock signals c4, c8 are never simultaneously high. Thus, nonoverlapping is ensured. Only the respective output buffer and the respective floating inverter contribute to the delay in each signal path.

Alternatively, in an embodiment not shown, if the output signal of the output buffer is not inverted with respect to the output signal of the floating inverter, it will be fed back to the first supply terminal v1, and the second supply terminal v2 will be connected to the bottom supply voltage.

In a preferred embodiment, the two floating inverters sj1, sj2 are implemented in CMOS technology and each consist of a respective P-channel transistor P1, P2 and a respective N-channel transistor N1, N2. The source terminal of the N-channel transistor N1 in the first floating inverter sj1 is connected to the output of the second buffer-inverter jp2, and the source terminal of the N-channel transistor N2 in the second floating inverter sj2 is connected solely to the output of the first buffer-inverter jp1. The drain terminals of the P- and N-channel transistors P1, N1 and P2, N2 in each of the two floating inverters sj1, sj2 are connected together to form the output of the respective floating inverter.

Figure 4:
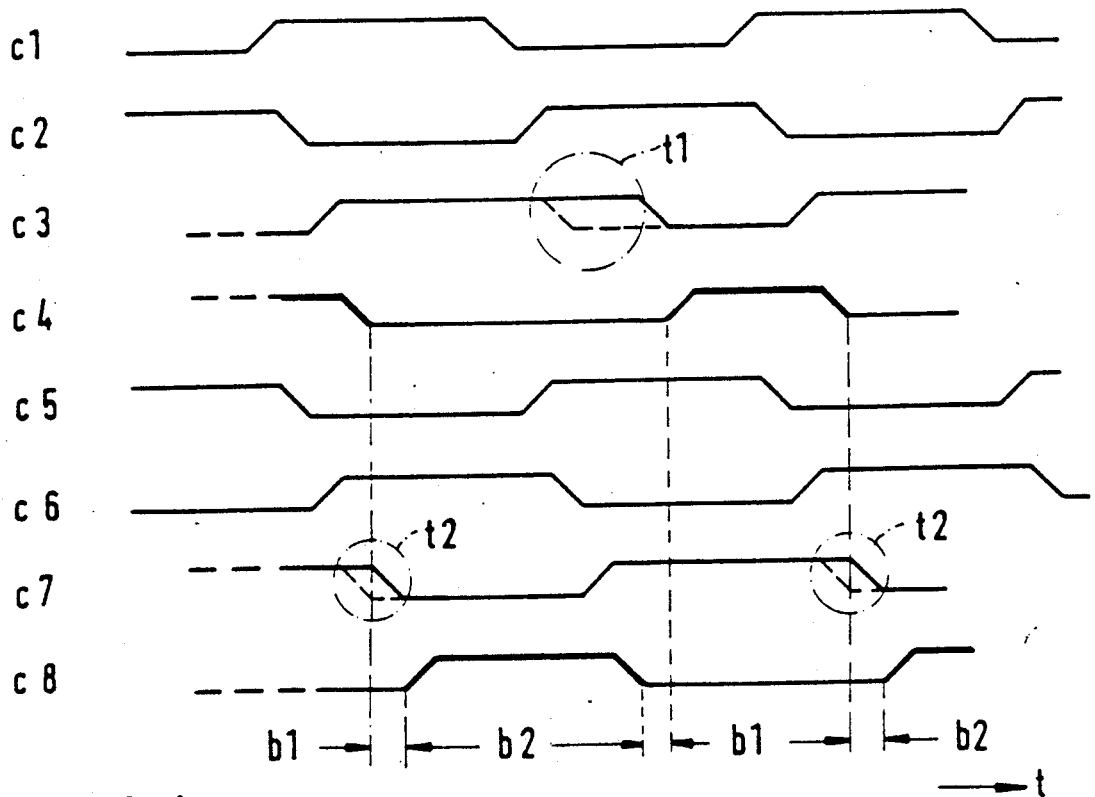
FIG. 4 is a timing diagram for the arrangement of FIG. 3.

In FIG. 4, the operation of the circuit arrangement of FIG. 3 is illustrated by a timing diagram showing eight signal waveforms c1 to c8. The first line shows the unipolar input clock c1 with a 1:1 mark/space ratio. Coupled directly to the input clock are the output signal c2 (shown in line 2) of the first inverter j1 and the output signals c5, c6 of the second and third inverters j2, j3. These output signals c5, c6 are shown in the fifth and sixth lines, respectively. The output signals c2, c6 of the first and third inverters, j1, j3 are the antiphase drive signals for the first and second floating inverters sj1, sj2. The output signal c3 of the first floating inverter sj1 is shown in the third line. Its positive-going edge follows the negative-going edge of the c2-signal after a gate delay. At the instant t1, a dashed line indicates how the trailing edge of the c3-signal would normally follow the leading edge of the c3-signal, but since the low end v2 of the first floating inverter sj1 is still in a high state at that instant t1 (as illustrated by the signal waveform c8), the c3-signal remains high until the c8-signal changes to the low state at the end of the second time interval b2.

The operation is similar in the case of the second floating inverter sj2, whose input and output are the c6-signal and c7-signal, respectively. The leading edge of the c7-signal follows the trailing edge of the c6-signal after a gate delay. The leading edge of the c6-signal would normally be followed by a trailing edge in the c7-signal as indicated in the latter by a dashed line at the instant t2. Since, at that instant, the low end v2 of the second floating inverter sj2 is not yet at a low potential because the c4-signal is just changing from high to low, the trailing edge of the c7-signal is delayed by a small amount. The delayed high-to-low transition of the c7-signal causes the leading edge of the c8-signal, i.e., of the second clock, to be delayed by at least the same amount of time.

Thus, an active first time interval b1 and an active second time interval b2 are obtained for the first clock c4 and second clock c8, respectively. In these two time intervals b1, b2, it is ensured that the H levels of the two clocks c4, c8 do not overlap. A comparison between the two representations of FIGS. 2 and 4 shows that the nonoverlap periods in FIG. 4 are clearly shorter.

The two-phase clock generator is very easy to implement in CMOS technology. The incorporation of the two output buffers jp1, jp2 into the clock feedback assures that despite the short nonoverlap time, the nonoverlapping of the two clocks c4, c8 is ensured even if the load to be driven by the output buffers is very large.

I claim:

1. A two-phase-clock generator which generates a first clock and a nonoverlapping second clock from an input clock by utilizing gate delays, comprising:
   a first floating inverter and a second floating inverter each having an input, an output, a first supply terminal and a second supply terminal, said input of said first logic gate and said input of said second logic gate being coupled to said input clock in antiphase, and said first supply terminals of each of said first and second floating inverters connected to a supply voltage;
   a first output buffer having an input coupled to said output of said first floating inverter and having an output that provides said first clock, said output further being provided as feedback to said second supply terminal of said second floating inverter; and
   a second output buffer having an input coupled to said output of said second floating inverter and having an output that provides said nonoverlapping second clock, said output further being provides as feedback to said second supply terminal of said first floating inverter.

2. The two-phase-clock generator as defined in claim 1, wherein:
   said first output buffer comprises a first buffer-inverter having its input connected directly to said output of said first floating inverter; and
   a second output buffer comprises a second buffer-inverter having its input connected directly to said output of said second floating inverter.

3. The two-phase-clock generator as defined in claim 2, wherein:
   said first and second floating inverters are CMOS inverters each comprising a P-channel transistor and an N-channel transistor, each transistor having a source terminal and a drain terminal;
   said source terminals of both P-channel transistors are connected to a positive supply voltage;
   said source terminal of the N-channel transistor in said first floating inverter is connected to said output of said second buffer-inverter; and
   said source terminal of said N-channel transistor in said second floating inverter is connected to said output of said first buffer-inverter.

* * * * *